US011894348B2

(12) United States Patent
Nagasaki et al.

(10) Patent No.: US 11,894,348 B2
(45) Date of Patent: Feb. 6, 2024

(54) POWER SEMICONDUCTOR DEVICE

(71) Applicant: Hitachi Astemo, Ltd., Hitachinaka (JP)

(72) Inventors: Hironori Nagasaki, Tokyo (JP); Toru Kato, Hitachinaka (JP); Takashi Hirao, Tokyo (JP); Shintaro Tanaka, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 221 days.

(21) Appl. No.: 17/439,048

(22) PCT Filed: Jan. 30, 2020

(86) PCT No.: PCT/JP2020/003314
§ 371 (c)(1),
(2) Date: Sep. 14, 2021

(87) PCT Pub. No.: WO2020/195140
PCT Pub. Date: Oct. 1, 2020

(65) Prior Publication Data
US 2022/0157788 A1 May 19, 2022

(30) Foreign Application Priority Data

Mar. 28, 2019 (JP) .................................. 2019-062196

(51) Int. Cl.
*H01L 25/07* (2006.01)
*H01L 23/538* (2006.01)
(Continued)

(52) U.S. Cl.
CPC ........ *H01L 25/072* (2013.01); *H01L 23/5385* (2013.01); *H01L 24/48* (2013.01); *H01L 25/50* (2013.01); *H01L 2224/48225* (2013.01)

(58) Field of Classification Search
CPC ... H01L 25/072; H01L 25/50; H01L 23/5385; H01L 24/48
See application file for complete search history.

(56) References Cited

U.S. PATENT DOCUMENTS

2006/0022355 A1   2/2006 Murai et al.
2016/0027711 A1*  1/2016 Harada ............. H01L 23/49827
                                                        257/698
(Continued)

FOREIGN PATENT DOCUMENTS

JP    2006-066895 A    3/2006
JP    2013-115167 A    6/2013
(Continued)

OTHER PUBLICATIONS

International Search Report with English translation and Written Opinion issued in corresponding application No. PCT/JP2020/003314 dated May 26, 2020.

*Primary Examiner* — Marc Anthony Armand
(74) *Attorney, Agent, or Firm* — Foley & Lardner LLP

(57) ABSTRACT

A power semiconductor device includes a first submodule including a first power semiconductor element, a second submodule including a second power semiconductor element, a positive electrode side conductor portion and a negative electrode side conductor portion, an intermediate substrate that forms a negative electrode side facing portion facing the negative electrode side conductor portion with the first submodule sandwiched between them and a positive electrode side facing portion facing the positive electrode side conductor portion with the second submodule sandwiched between them, and a plurality of signal terminals that transmit a signal for controlling the first power semiconductor element or the second power semiconductor element. The second submodule is disposed such that directions of an electrode surface of the second power semiconductor element and an electrode surface of the first power semiconductor element are inverted, a signal relay conductor portion is disposed in a space sandwiched between a part of the second submodule and the intermediate substrate in a height direction of the second submodule, and the intermediate (Continued)

substrate has a wire connected to the signal relay conductor portion and electrically connected to the signal terminal. In this manner, productivity of the power semiconductor device is improved while an increase in main circuit inductance is suppressed.

5 Claims, 25 Drawing Sheets

(51) Int. Cl.
*H01L 23/00* (2006.01)
*H01L 25/00* (2006.01)

(56) References Cited

U.S. PATENT DOCUMENTS

2017/0323847 A1* 11/2017 Jeon .................. H01L 23/4334
2020/0303360 A1   9/2020 Tokuyama et al.

FOREIGN PATENT DOCUMENTS

| JP | 2014-023327 A | 2/2014 |
| JP | 2017-183430 A | 10/2017 |
| WO | WO-2017/168992 A1 | 10/2017 |

* cited by examiner

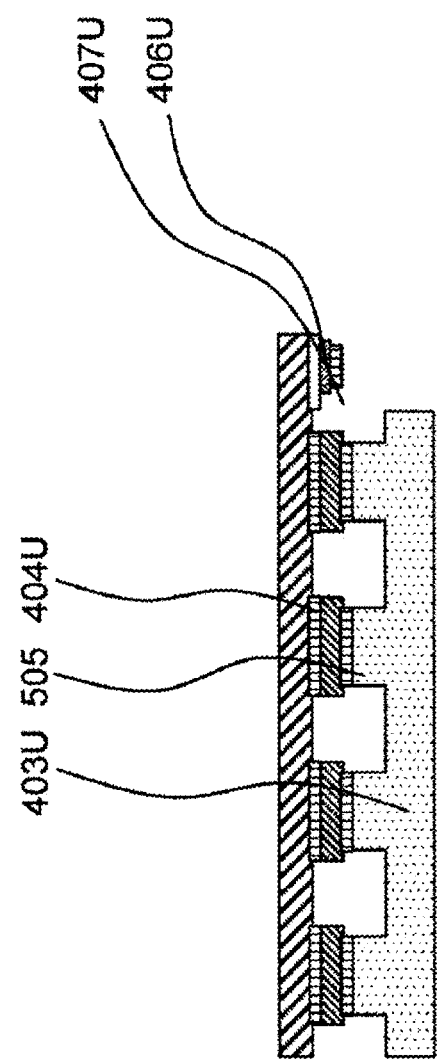
FIG. 16(a-1)

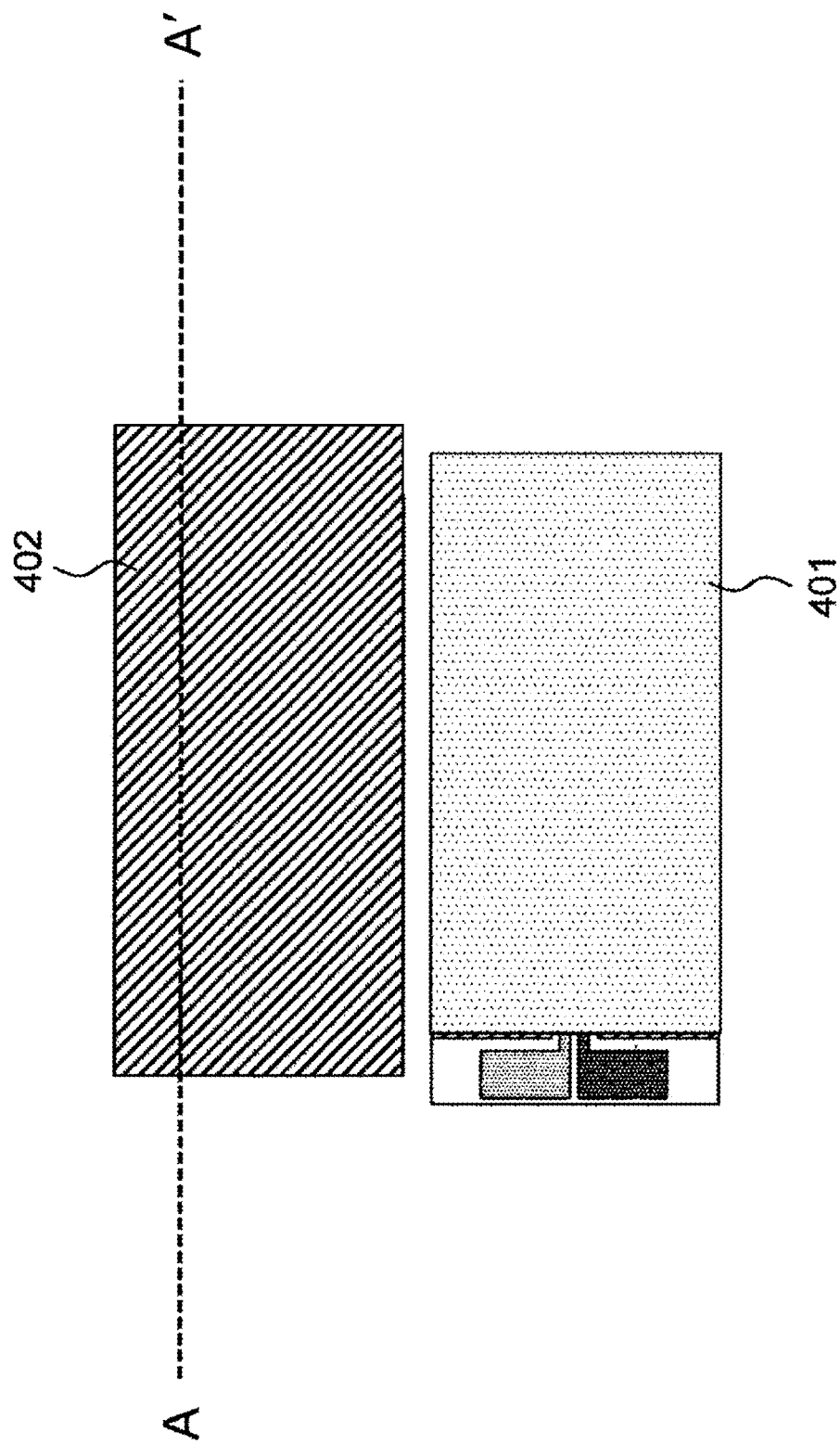
FIG. 16(a-2)

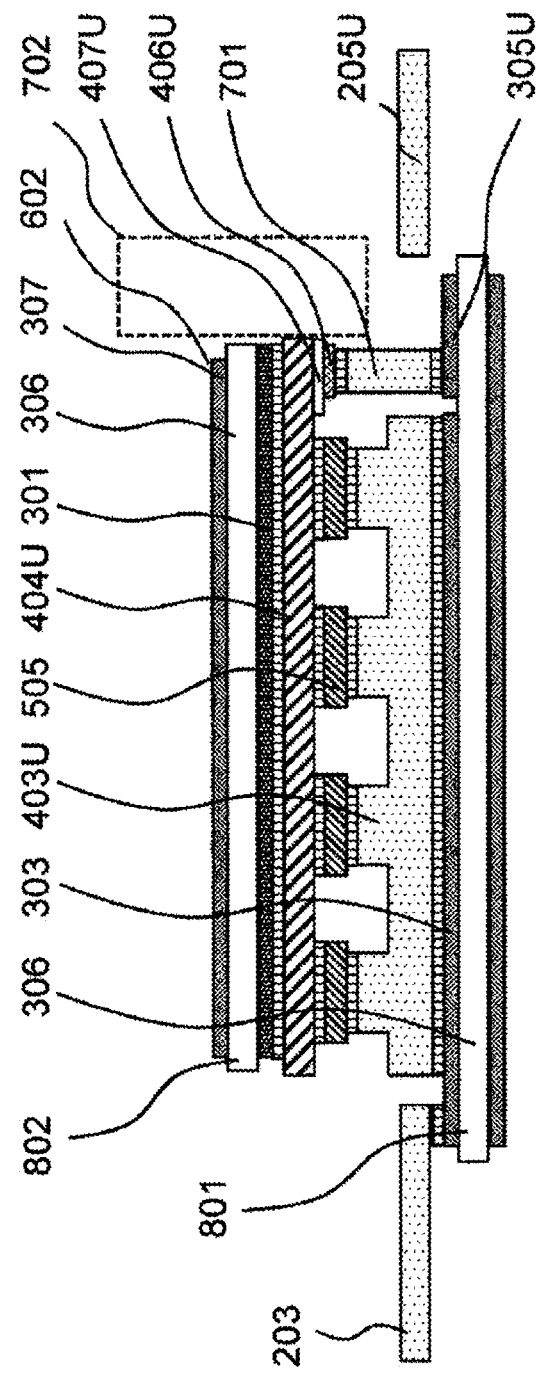
FIG. 16(b-1)

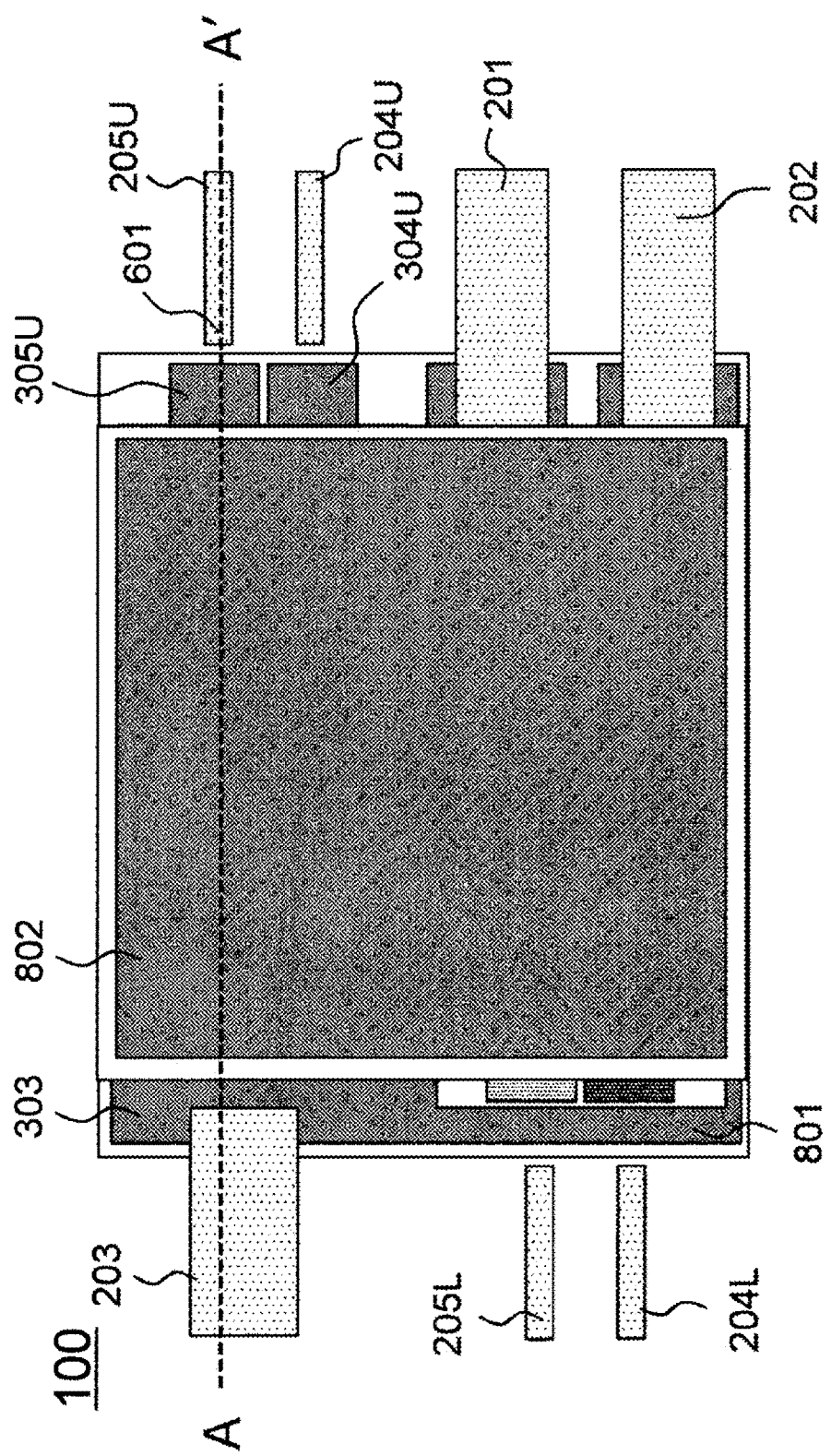
FIG. 16(b-2)

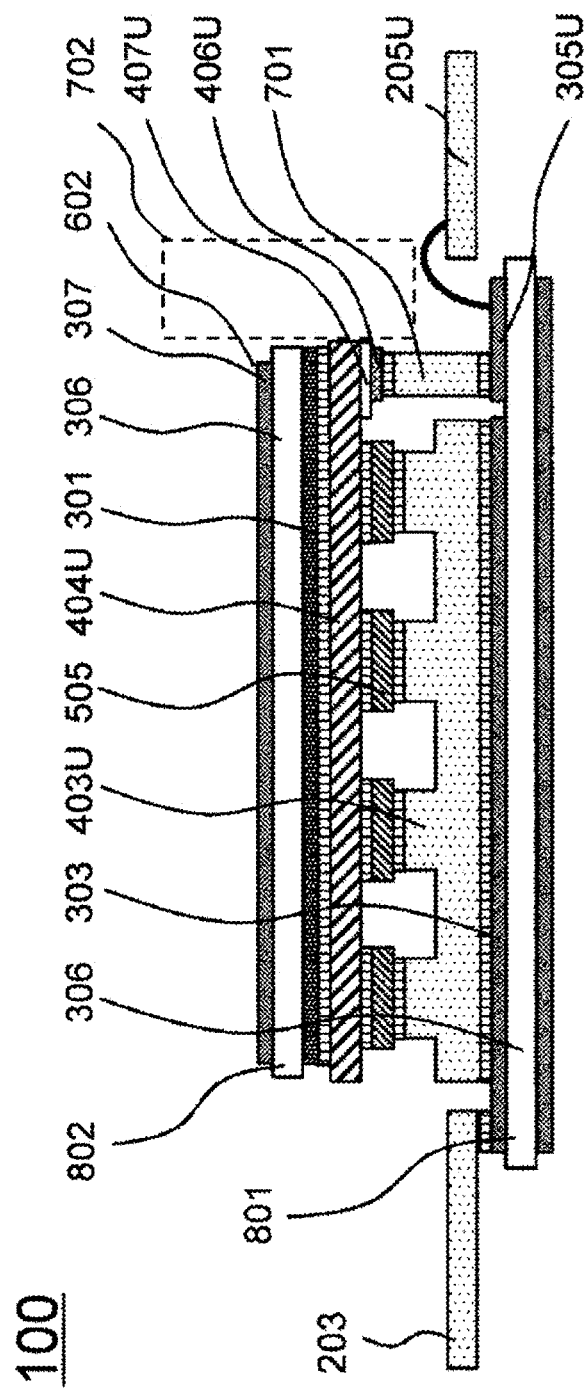
FIG. 16(c-1)

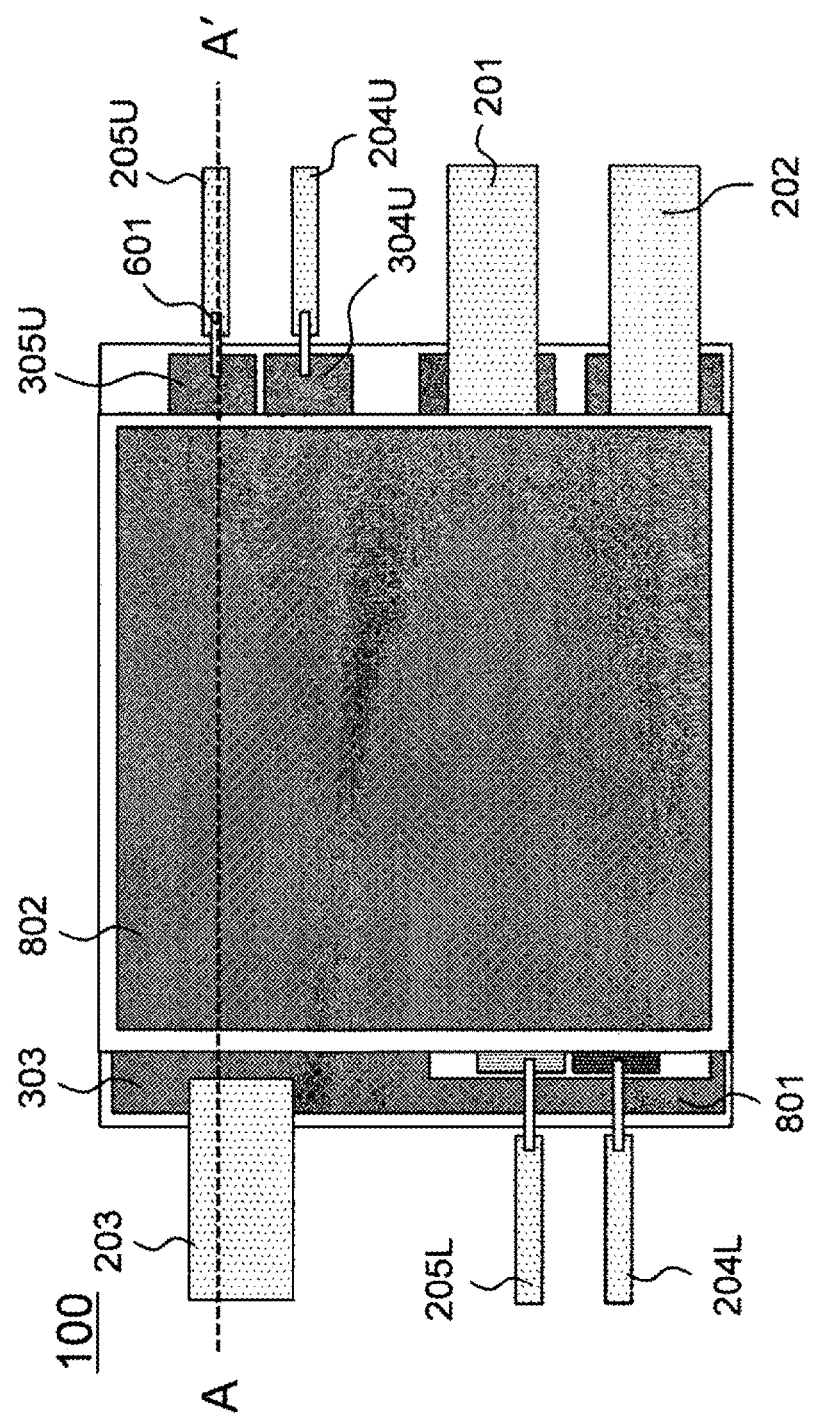
FIG. 16(c-2)

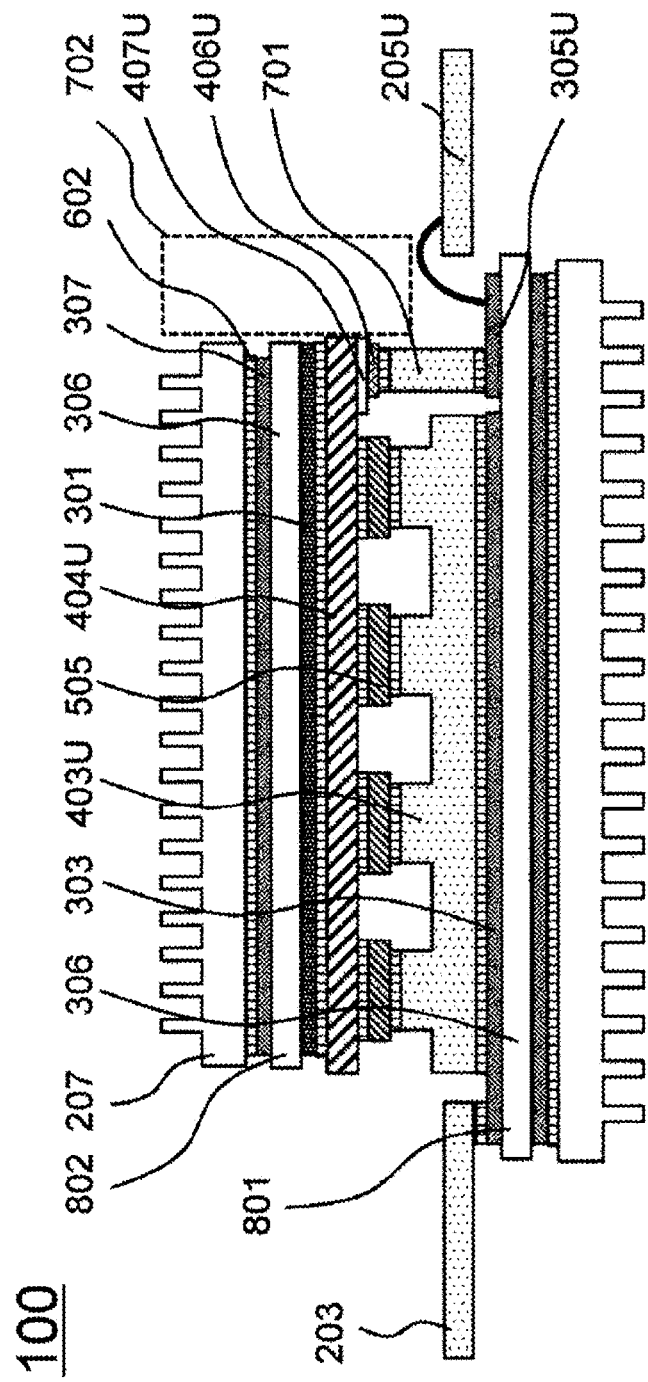
FIG. 16(d-1)

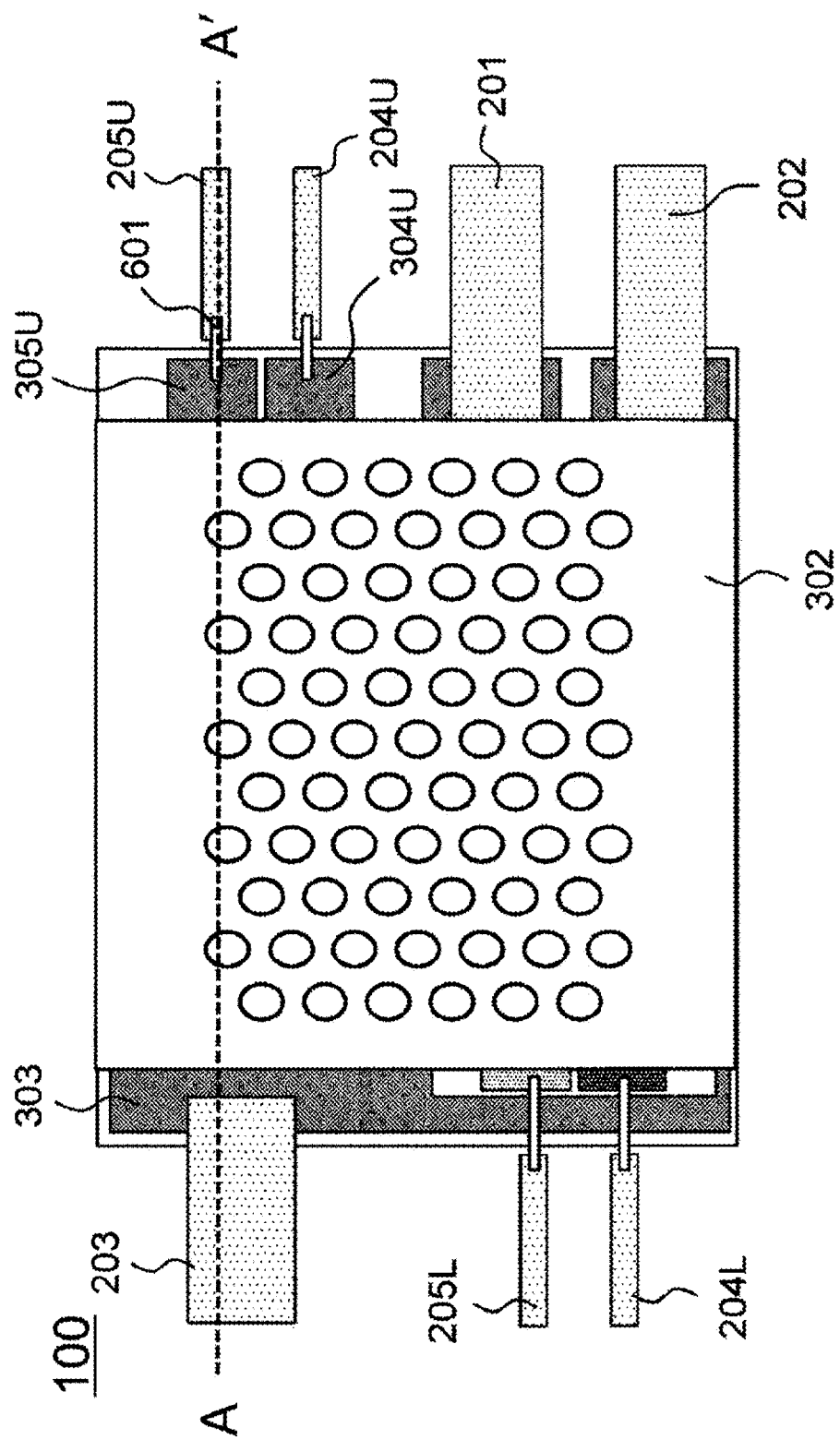

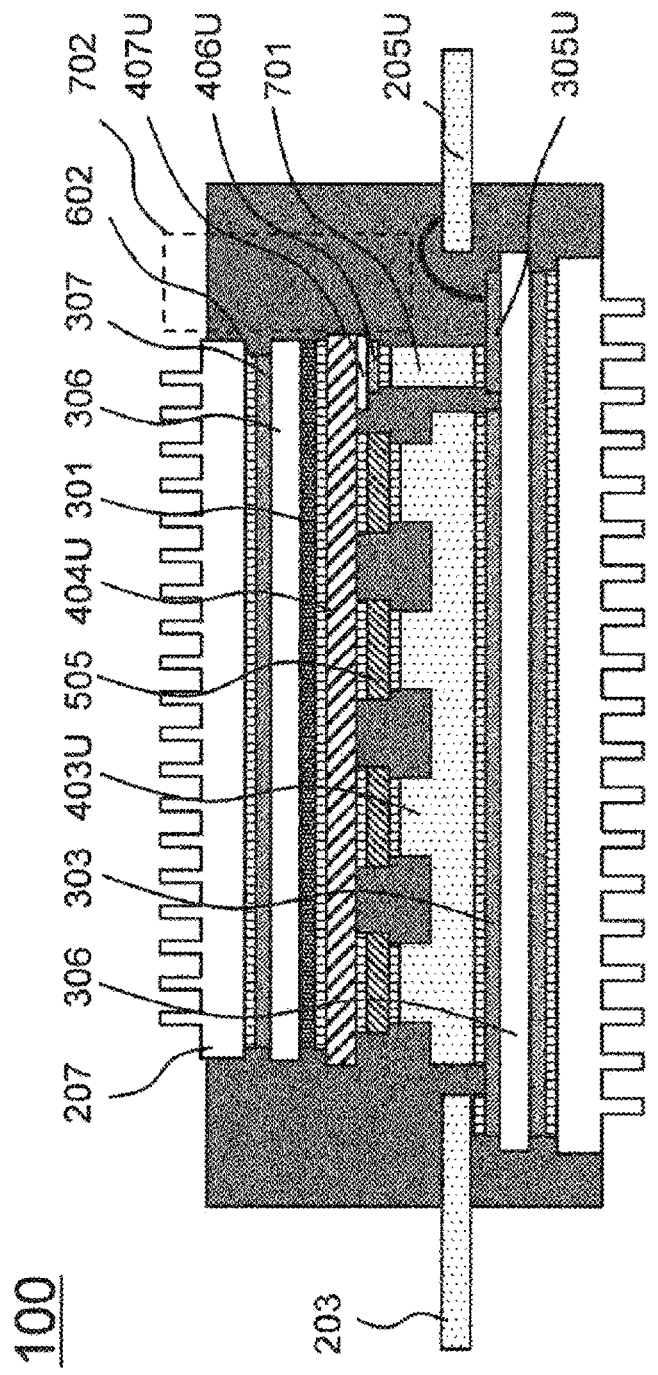
FIG. 16(e-1)

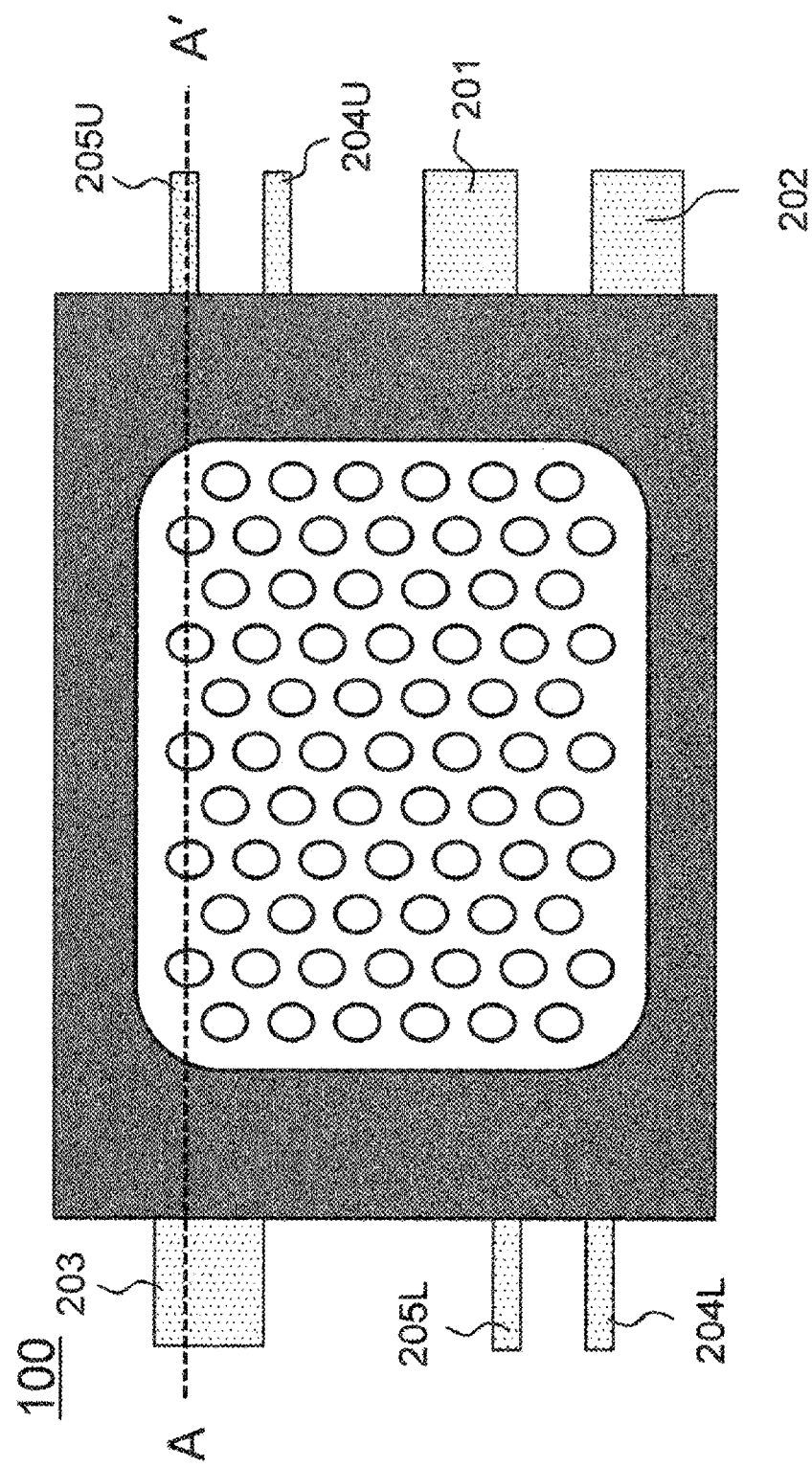
FIG. 16(e-2)

POWER SEMICONDUCTOR DEVICE

TECHNICAL FIELD

The present invention relates to a power semiconductor device, and, in particular, to a power semiconductor device that controls an in-vehicle motor for driving.

BACKGROUND ART

In recent years, an in-vehicle power conversion device has been required to have high power density. In order to increase the power density, it is necessary to reduce loss and suppress heat generation. As one method for reducing the loss, there is a method of reducing the switching loss by increasing the switching speed. However, the surge voltage increases as the switching speed increases.

Therefore, it is necessary to reduce the parasitic inductance of a main circuit that causes the surge voltage. PTL 1 discloses a structure in which a power semiconductor element is cooled from both sides in order to enhance heat dissipation. PTL 2 discloses a structure in which a power semiconductor element of one arm which is one of upper and lower arms is inverted in order to reduce inductance and improve cooling performance.

However, in a case the structure in which the single-arm power semiconductor element is inverted as in PTL 2 is to be applied to the double-sided cooling structure as in PTL 1, it is required to further improve the productivity of the power semiconductor device including upper and lower arms.

CITATION LIST

Patent Literature

PTL 1: JP 2014-23327 A
PTL 2: JP 2017-183430 A

SUMMARY OF INVENTION

Technical Problem

An object of the present invention is to improve productivity of a power semiconductor device while suppressing an increase in main circuit inductance.

Solution to Problem

A power semiconductor device according to the present invention includes a first submodule including a first power semiconductor element, a second submodule including a second power semiconductor element, a positive electrode side conductor portion and a negative electrode side conductor portion, an intermediate substrate that forms a negative electrode side facing portion facing the negative electrode side conductor portion with the first submodule sandwiched between them and a positive electrode side facing portion facing the positive electrode side conductor portion with the second submodule sandwiched between them, and a plurality of signal terminals that transmit a signal for controlling the first power semiconductor element or the second power semiconductor element. The second submodule is disposed such that directions of an electrode surface of the second power semiconductor element and an electrode surface of the first power semiconductor element are inverted, a signal relay conductor portion is disposed in a space sandwiched between a part of the second submodule and the intermediate substrate in a height direction of the second submodule, and the intermediate substrate has a wire connected to the signal relay conductor portion and electrically connected to the signal terminal.

Advantageous Effects of Invention

According to the present invention, it is possible to improve productivity of a power semiconductor device while suppressing an increase in main circuit inductance.

Figure 1:
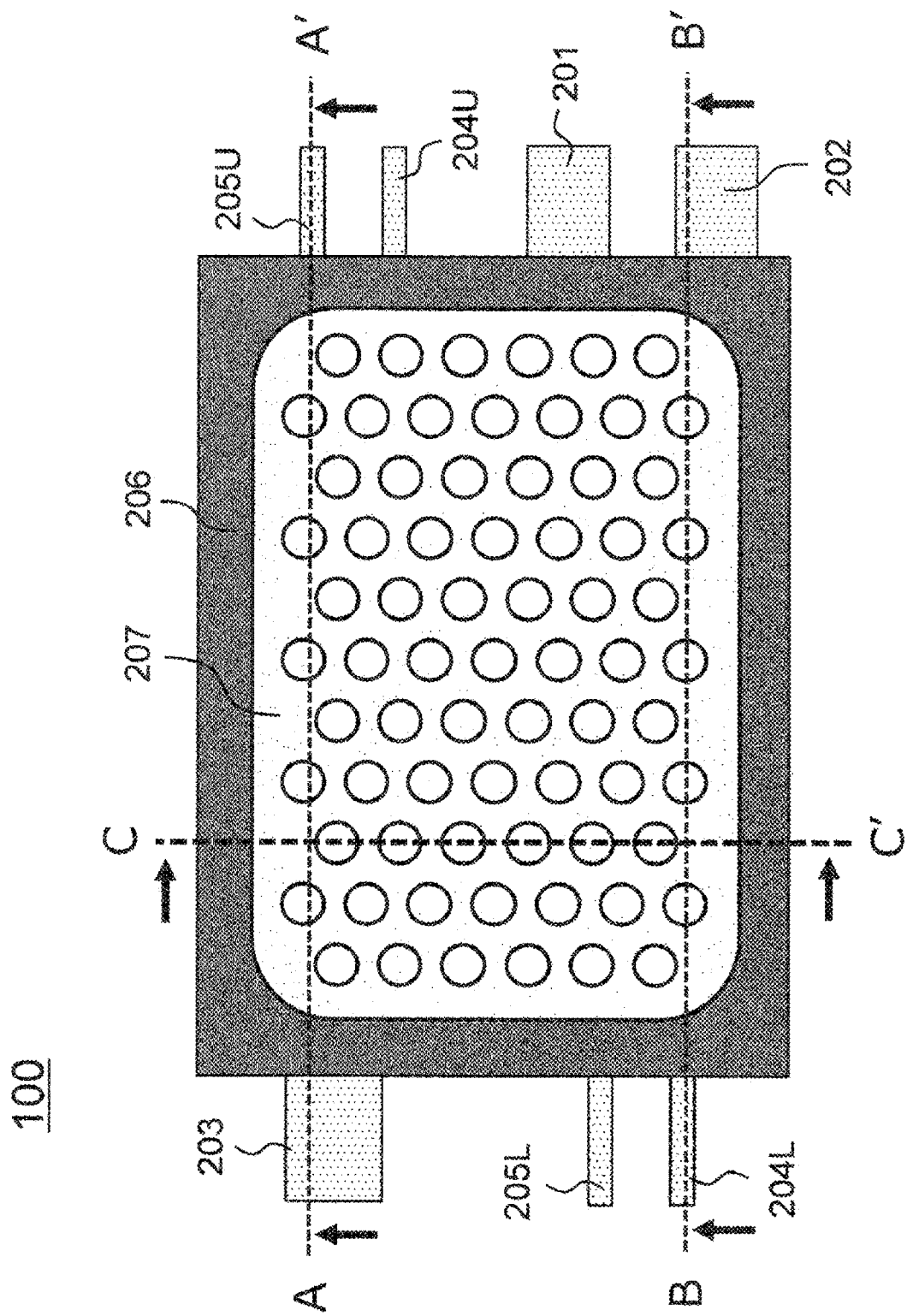
FIG. 1 is an external front view of a power semiconductor device 100 according to the present embodiment.
Figure 15:
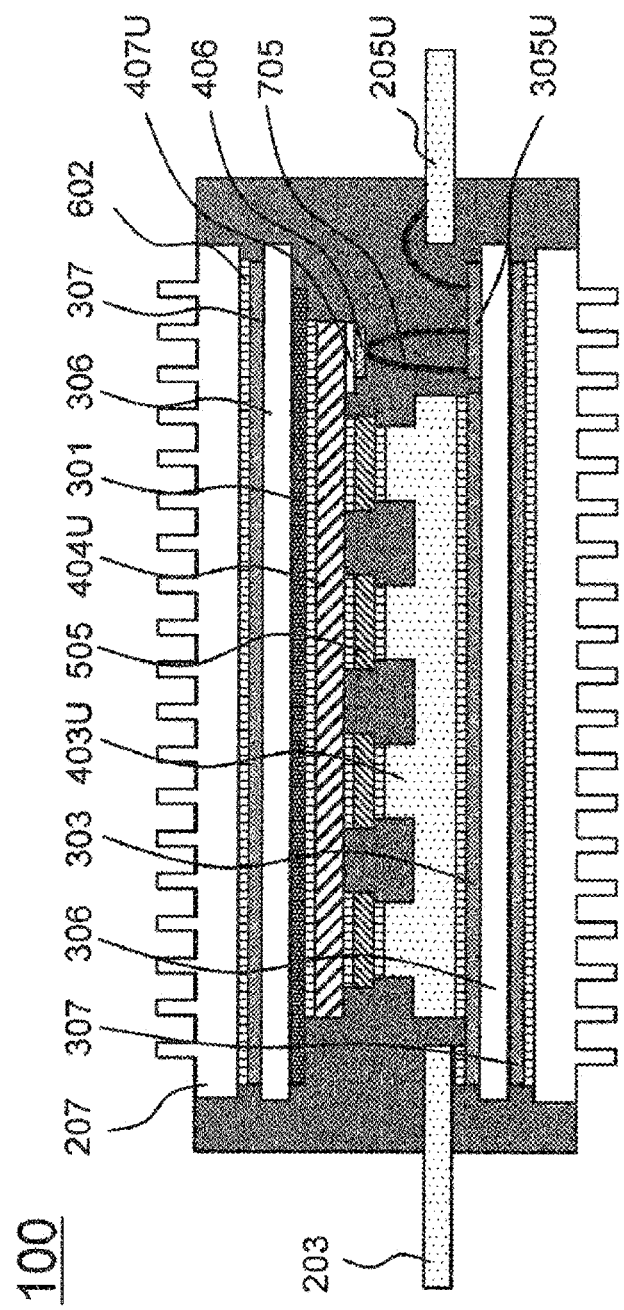

FIG. 15 is a cross-sectional view of a cross section passing through the alternate long and short dash line A-A' of the power semiconductor device 100 illustrated in FIG. 1 as viewed from an arrow direction according to a fourth embodiment.

FIG. 16(a-1) is a cross-sectional view of a first submodule and a second submodule illustrating a manufacturing process of the power semiconductor device according to the second embodiment.

FIG. 16(a-2) is a top view of a first submodule and a second submodule illustrating a manufacturing process of the power semiconductor device according to the second embodiment.

FIG. 16(b-1) is a cross-sectional view illustrating the manufacturing process of the power semiconductor device according to the second embodiment, in which the first submodule and the second submodule are mounted on an AC output-side substrate 801 and a DC input-side substrate 802.

FIG. 16(b-2) is a top view illustrating the manufacturing process of the power semiconductor device according to the second embodiment, in which the first submodule and the second submodule are mounted on the AC output-side substrate 801 and the DC input-side substrate 802.

FIG. 16(c-1) is a cross-sectional view illustrating the manufacturing process of the power semiconductor device according to the second embodiment in which a wire bonding 601 is connected to FIG. 16(b-1).

FIG. 16(c-2) is a top view illustrating the manufacturing process of the power semiconductor device according to the second embodiment in which the wire bonding 601 is connected to FIG. 16(b-2).

FIG. 16(d-1) is a cross-sectional view illustrating the manufacturing process of the power semiconductor device according to the second embodiment in which the cooling metal portion 207 is mounted in FIG. 16(c-1).

FIG. 16(d-2) is a top view illustrating the manufacturing process of the power semiconductor device according to the second embodiment in which the cooling metal portion 207 is mounted in FIG. 16(c-2).

FIG. 16(e-1) is a cross-sectional view illustrating the manufacturing process of the power semiconductor device according to the second embodiment in which FIG. 16(d-1) is resin-sealed.

FIG. 16(e-2) is a top view illustrating the manufacturing process of the power semiconductor device according to the second embodiment in which FIG. 16(d-2) is resin-sealed.

DESCRIPTION OF EMBODIMENTS

Hereinafter, an embodiment of a power semiconductor device according to the present invention will be described with reference to the drawings. Note that, in the drawings, the same elements are denoted by the same reference numerals, and redundant description is omitted. The present invention is not limited to the embodiments below, and various modifications and applications within the technical concept of the present invention are also included in the scope of the present invention.

First Embodiment

A power semiconductor device 100 according to a first embodiment will be described with reference to FIGS. 1 to 10.

FIG. 1 is an external front view of the power semiconductor device 100 according to the first embodiment. As illustrated in FIG. 1, the power semiconductor device 100 includes a high-potential side terminal 201, a low-potential side terminal 202, an AC output terminal 203, positive sense terminals 204U and 204L, negative sense terminals 205U and 205L, and a cooling metal portion 207. A part of these is resin-sealed by a molding material 206. This ensures insulation between the members.

The high-potential side terminal 201, the low-potential side terminal 202, the AC output terminal 203, the positive sense terminal 204, and the negative sense terminal 205 protrude from the molding material 206 and are connected to an external device. The cooling metal portion 207 includes a fin on a surface. In this manner, cooling performance can be improved.

Next, a stacked structure of the power semiconductor 100 will be described with reference to FIGS. 3 and 8 to 10.

Figure 2:
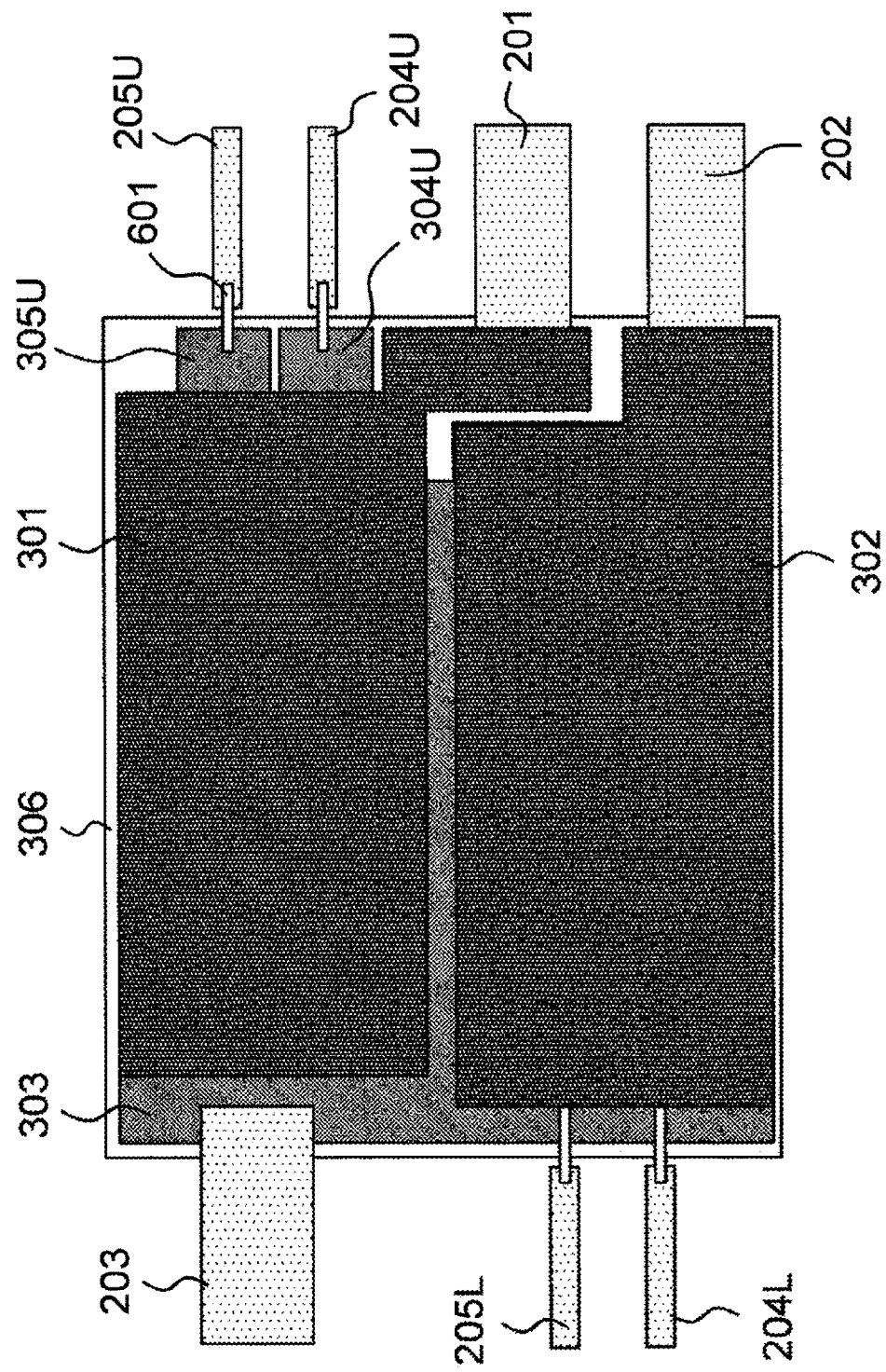
FIG. 2 is an internal structure diagram of the power semiconductor device 100 illustrated in FIG. 1 from which a molding material 206, a cooling metal portion 207, an insulating layer 306, a solder joint pattern 307, and a soldering material 602 are removed.
Figure 3:
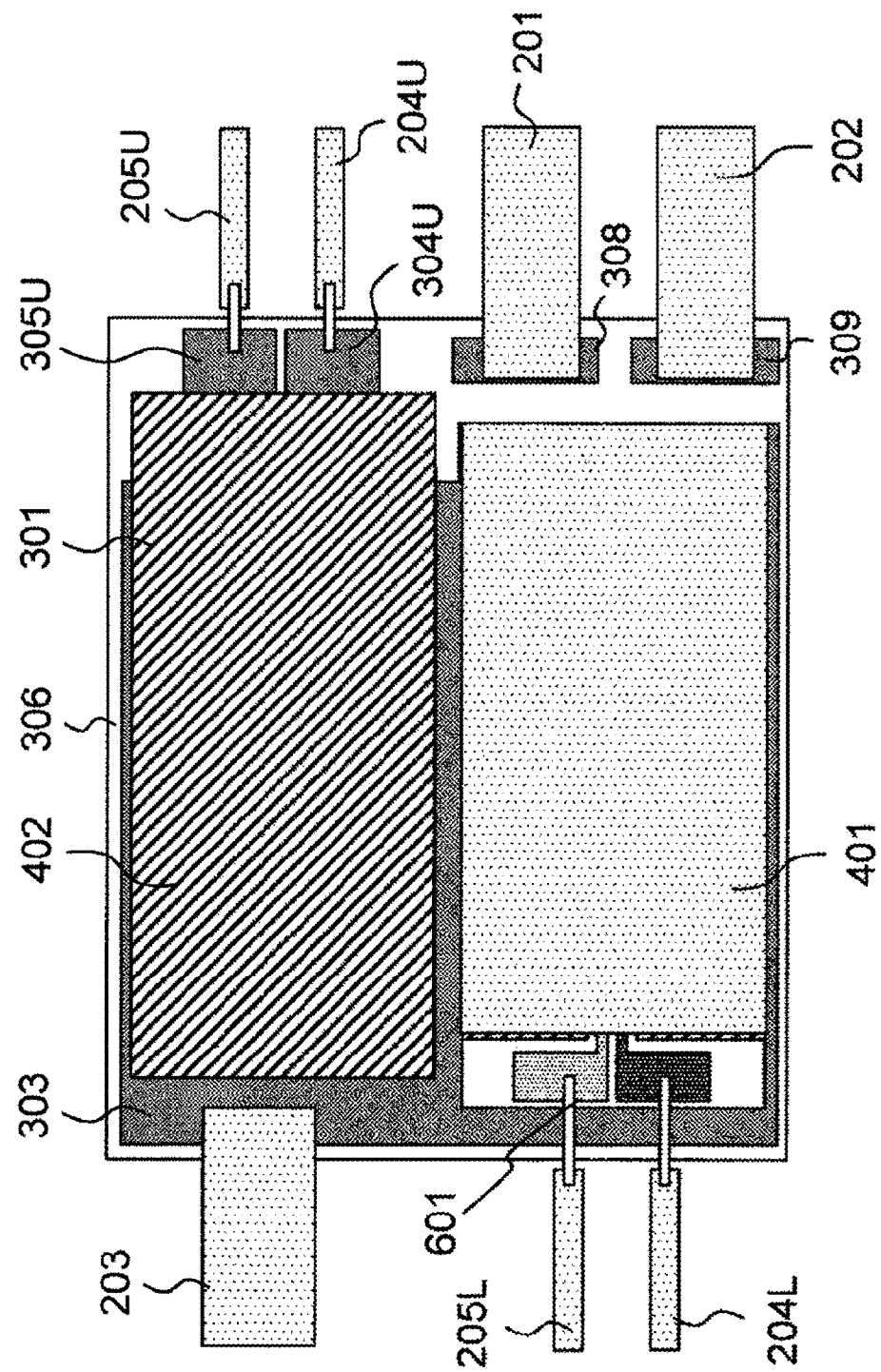
FIG. 3 is an internal structure diagram of the power semiconductor device 100 illustrated in FIG. 2 from which a high-potential side wire 301 and a low-potential side wire 302 are removed.
Figure 8:
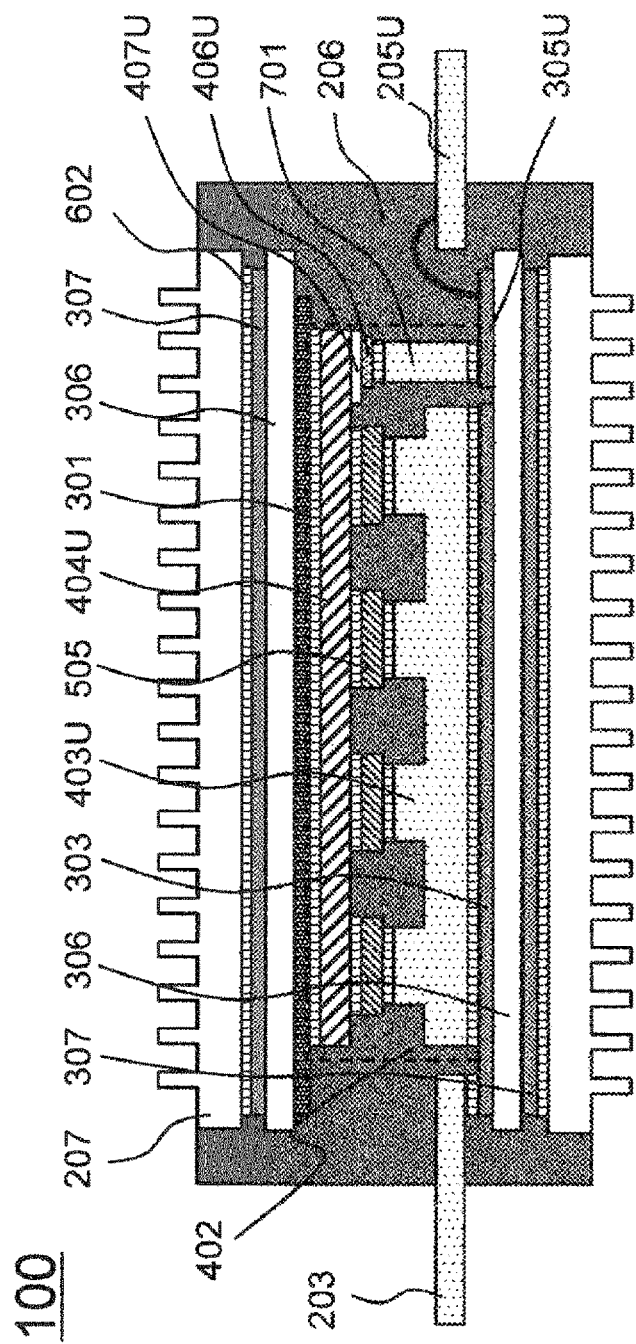
FIG. 8 is a cross-sectional view of a cross section passing through an alternate long and short dash line A-A' of the power semiconductor device 100 illustrated in FIG. 1 as viewed from an arrow direction.
Figure 9:
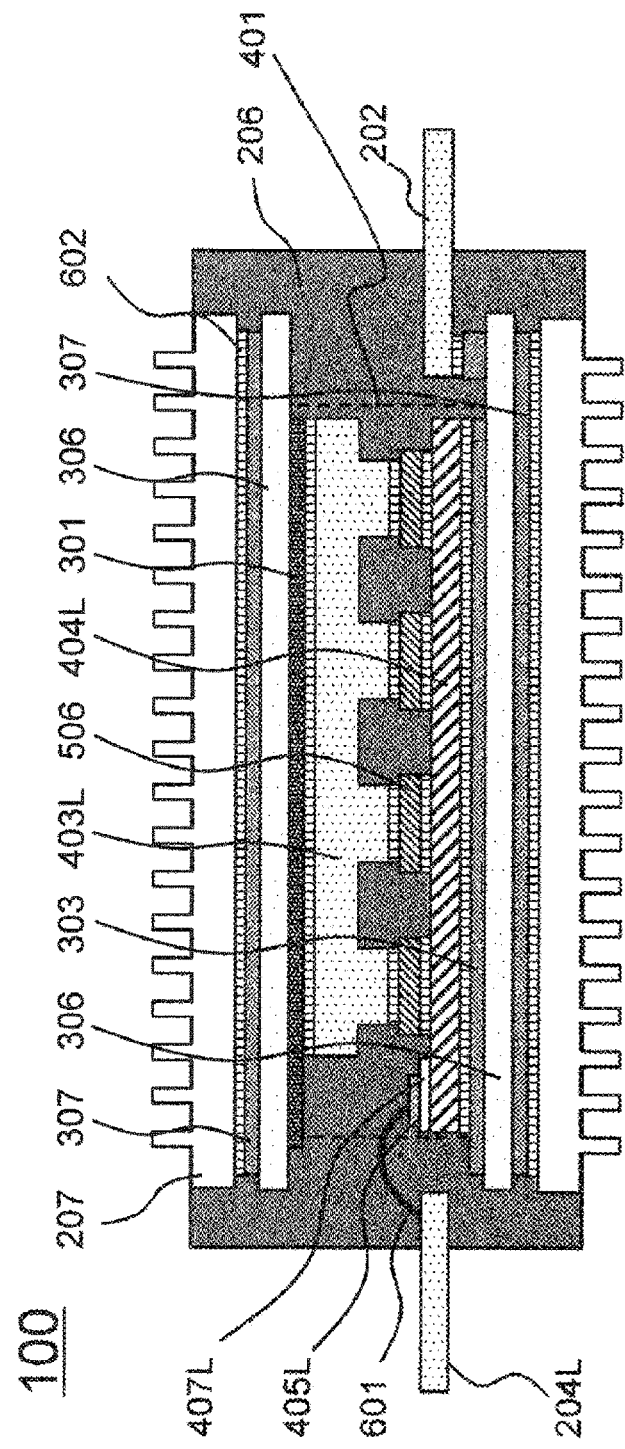
FIG. 9 is a cross-sectional view of a cross section passing through an alternate long and short dash line B-B' of the power semiconductor device 100 illustrated in FIG. 1 as viewed from an arrow direction.
Figure 10:
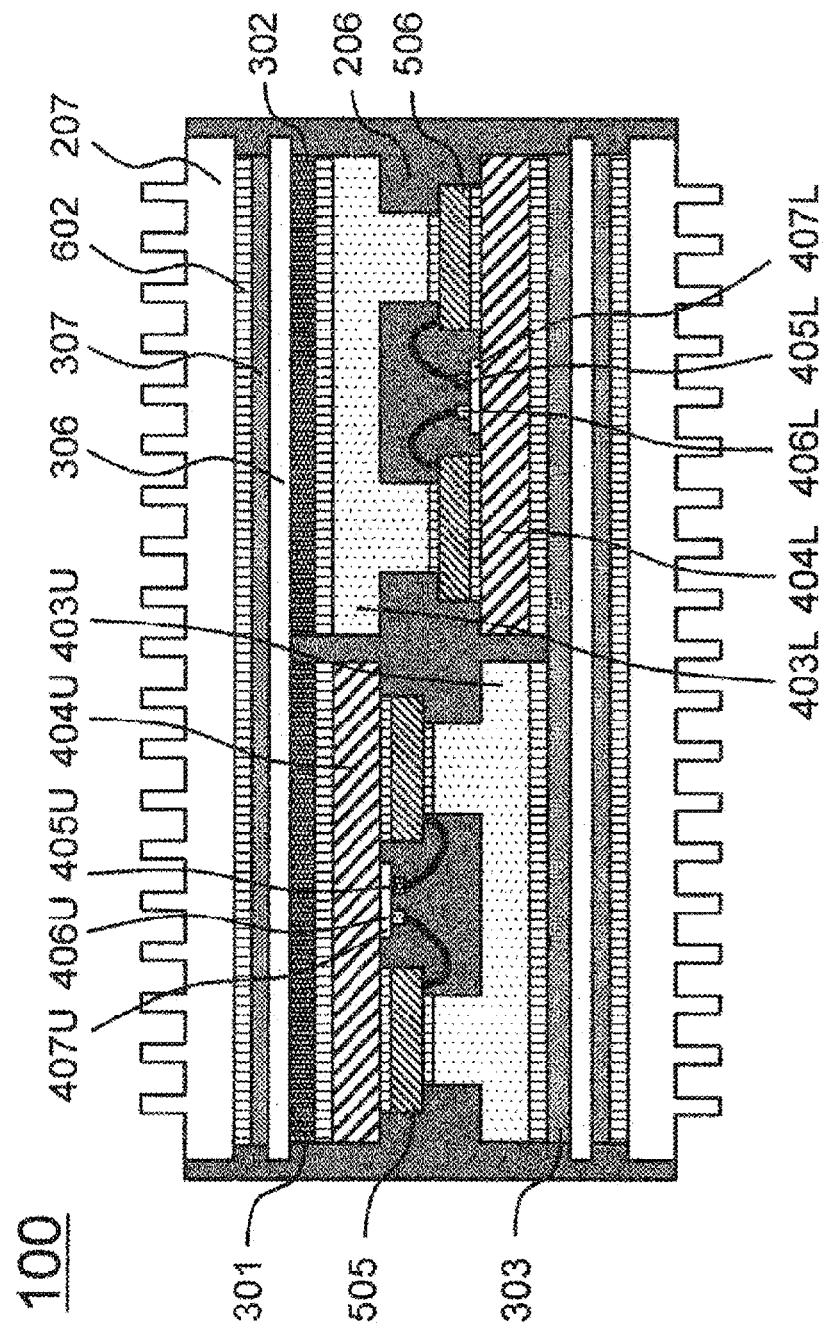
FIG. 10 is a cross-sectional view of a cross section passing through an alternate long and short dash line C-C' of the power semiconductor device 100 illustrated in FIG. 1 as viewed from an arrow direction.

FIG. 3 is an internal structure diagram of the power semiconductor device 100 illustrated in FIG. 2 from which a high-potential side wire 301 and a low-potential side wire 302 are removed. FIG. 8 is a cross-sectional view of a cross section passing through an alternate long and short dash line A-A' of the power semiconductor device 100 illustrated in FIG. 1 as viewed from an arrow direction. FIG. 9 is a cross-sectional view of a cross section passing through an alternate long and short dash line B-B' of the power semiconductor device 100 illustrated in FIG. 1 as viewed from an arrow direction. FIG. 10 is a cross-sectional view of a cross section passing through an alternate long and short dash line C-C' of the power semiconductor device 100 illustrated in FIG. 1 as viewed from an arrow direction.

As illustrated in FIGS. 8, 9, and 10, the high-potential side wire 301 and the low-potential side wire 302 are formed on the surface of the insulating layer 306 on the upper side when viewed from the cross-sectional direction. Further, a solder joint pattern 307 for thermally connecting the cooling metal portion 207 is formed on the surface on the opposite side. The solder joint pattern 307 is thermally connected to the cooling metal portion 207 via a soldering material 602.

As illustrated in FIGS. 3 and 8, an AC output wire 303, a positive sense wire 304U (see FIG. 3), a negative sense wire 305U (see FIG. 3), a high-potential side terminal joint pattern 308 (see FIG. 3), and a low-potential side terminal joint pattern 309 (see FIG. 3) are formed on one surface of the insulating layer 306 on the lower side as viewed from the cross-sectional direction. On the other surface, the solder joint pattern 307 for thermally connecting the cooling metal portion 207 is formed. The solder joint pattern 307 is thermally connected to the cooling metal portion 207 via a soldering material 602.

FIG. 2 is an internal structure diagram of the power semiconductor device 100 illustrated in FIG. 1 from which the molding material 206, the cooling metal portion 207, the insulating layer 306, the solder joint pattern 307, and the soldering material 602 are removed.

As illustrated in FIGS. 2 and 3, the low-potential side terminal 202 is electrically connected to the low-potential side terminal joint pattern 309 and the low-potential side wire 302 via the soldering material 602. Further, the low-potential side terminal 202 is electrically connected to the low-potential side of a capacitor (not shown) that smooths a DC voltage from the battery by screwing, laser welding, or the like.

Here, the structure of a submodule 400 will be described with reference to FIGS. 5, 6, and 7.

Figure 5:
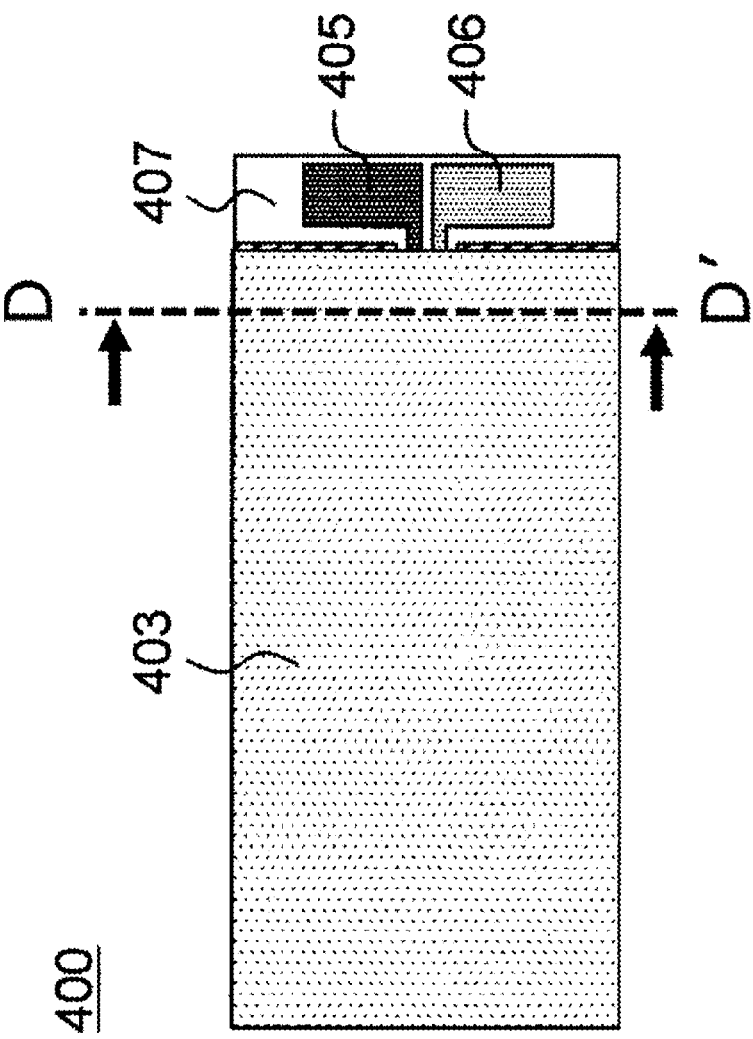
FIG. 5 is an external front view of a submodule 400 according to the present embodiment.

FIG. 5 is an external front view of the submodule 400 according to the present embodiment. FIG. 6 is an internal structure diagram of the submodule 400 illustrated in FIG. 5 from which an intra-submodule low-potential side conductor portion 403 is removed. FIG. 7 is a cross-sectional view of a cross section passing through an alternate long and short dash line D-D' of the submodule 400 illustrated in FIG. 5 as viewed from an arrow direction.

As a power semiconductor element 500, for example, a MOSFET or an IGBT is used. The power semiconductor device 100 includes a first power semiconductor element 505 constituting an upper arm of an inverter circuit and a second power semiconductor element 506 constituting a lower arm of the inverter circuit. FIGS. 5 to 7 illustrate the submodule 400 constituting the upper arm.

Figure 6:
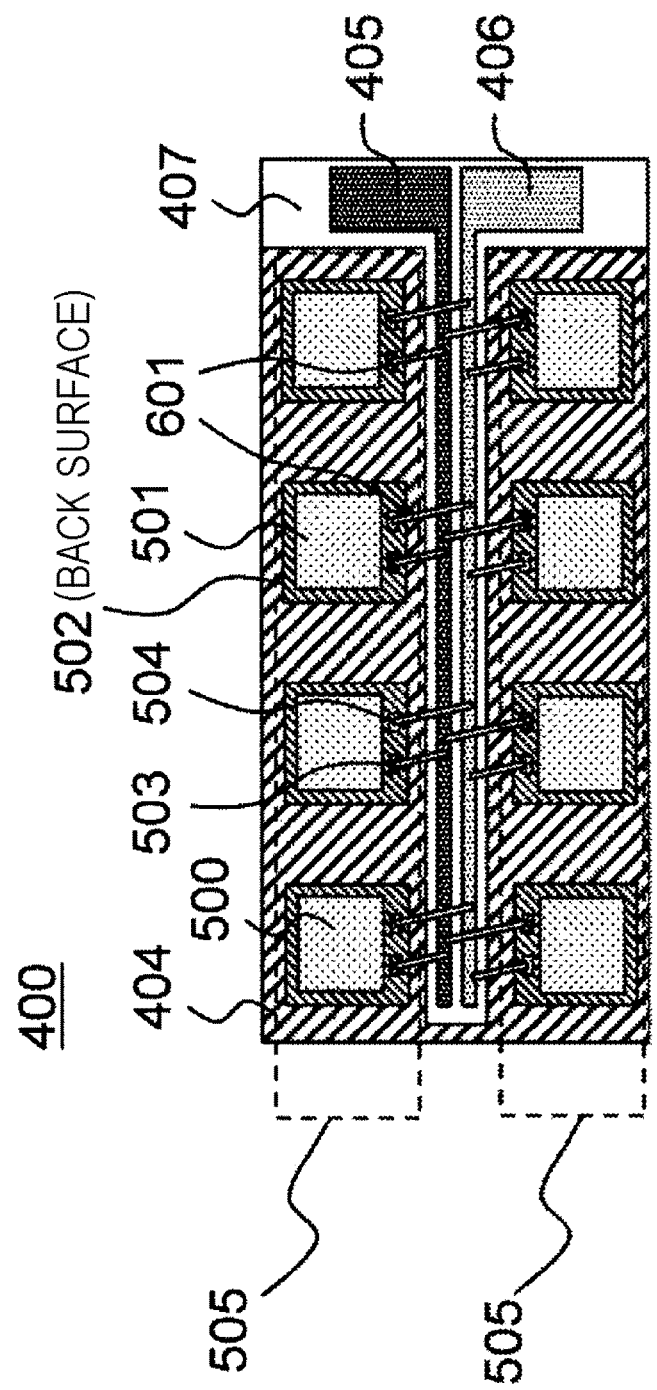
FIG. 6 is an internal structure diagram of the submodule 400 illustrated in FIG. 5 from which an intra-submodule low-potential side conductor portion 403 is removed.

As illustrated in FIG. 6, the first power semiconductor element 505 includes a positive sense electrode 503, a negative sense electrode 504, a low-potential side electrode 501, and a high-potential side electrode 502 (the back surface side of the power semiconductor element 500). In the case of an IGBT, the positive sense electrode 503 of these electrodes corresponds to a gate electrode, the negative sense electrode 504 corresponds to a Kelvin emitter electrode, the low-potential side electrode 501 corresponds to an emitter electrode, and the high-potential side electrode 502 corresponds to a collector electrode. In the case of a MOSFET, the positive sense electrode 503 corresponds to a gate electrode, the negative sense electrode 504 corresponds to a Kelvin source electrode, the low-potential side electrode 501 corresponds to a source electrode, and the high-potential side electrode 502 corresponds to a drain electrode.

Further, depending on the type of the power semiconductor element, there is also a power semiconductor element that does not have the negative sense electrode 504 and uses the low-potential side electrode 501 as a negative sense electrode, and such a semiconductor element can also be used in the present embodiment.

Figure 7:
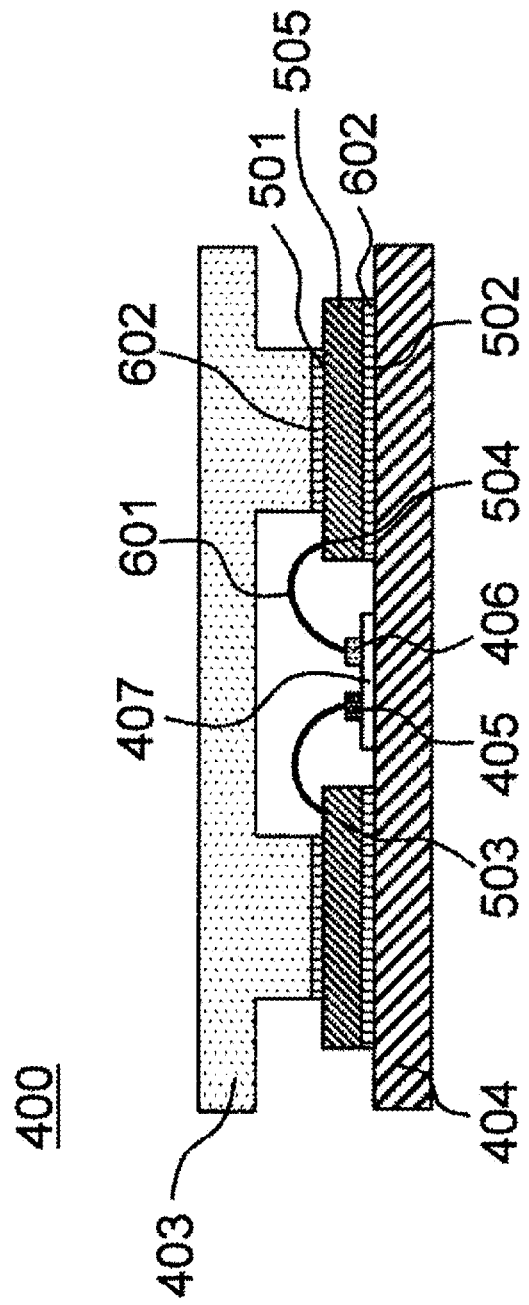
FIG. 7 is a cross-sectional view of a cross section passing through an alternate long and short dash line D-D' of the submodule 400 illustrated in FIG. 5 as viewed from an arrow direction.

As illustrated in FIG. 7, an intra-submodule high-potential side conductor portion 404 includes an intra-submodule insulating layer 407, an intra-submodule positive sense wire 405, and an intra-submodule negative sense wire 406.

The intra-submodule insulating layer 407 is formed in a region where the first power semiconductor element 505 is not mounted on the surface of the high-potential side conductor portion 404. The intra-submodule insulating layer 407 insulates the high-potential side conductor portion 404 from the intra-submodule positive sense wire 405 and the intra-submodule negative sense wire 406.

The intra-submodule positive sense wire 405 and the intra-submodule negative sense wire 406 are formed on the surface of the intra-submodule insulating layer 407, and each transmits an electrical signal to the power semiconductor 500.

Note that, in the present embodiment, the intra-submodule insulating layer 407 is formed in a T-shape. However, the intra-submodule insulating layer 407 is not necessarily in a T-shape, and various shapes are assumed depending on the arrangement of the first power semiconductor element 505.

The high-potential side electrode 502 is connected to the intra-submodule high-potential side conductor portion 404 via the soldering material 602.

The intra-submodule low-potential side conductor portion 403 is electrically connected to the low-potential side electrode 501 via the soldering material 602. The positive sense electrode 503 is electrically connected to the intra-submodule positive sense wire 405 via a wire bonding 601. The negative sense electrode 504 is electrically connected to the intra-submodule negative sense wire 406 via the wire bonding 601.

As illustrated in FIGS. 9 and 10, an intra-submodule low-potential side conductor portion 403L of the first submodule 401 is electrically connected to the low-potential side wire 302 via the soldering material 602. The intra-submodule high-potential side conductor portion 404L of the first submodule 401 is electrically connected to the AC output wire 303 via the soldering material 602.

Figure 4:
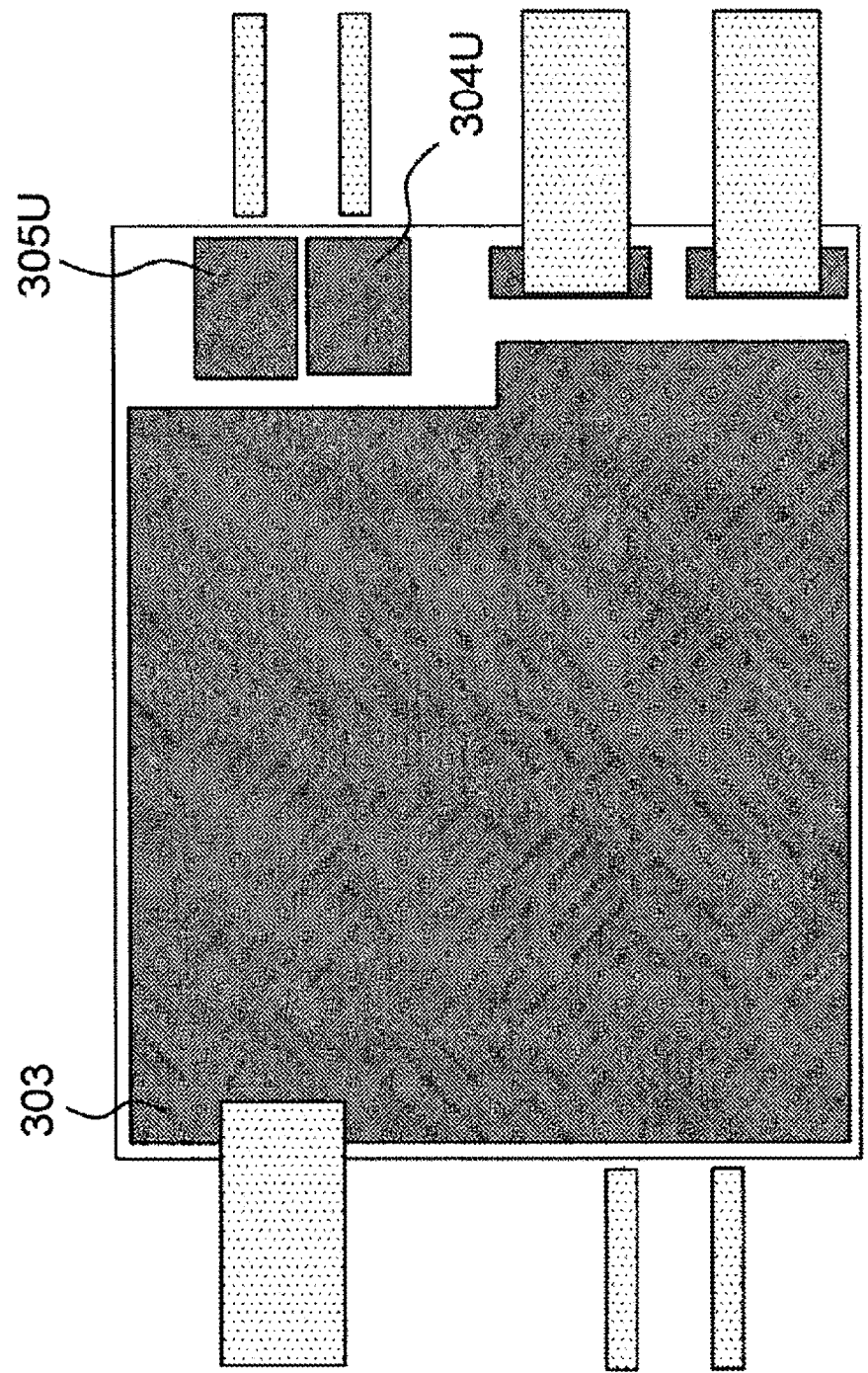
FIG. 4 is an internal structure diagram of the power semiconductor device 100 illustrated in FIG. 3 from which a first submodule 401 and a second submodule 402 are removed.

FIG. 3 is an internal structure diagram of the power semiconductor device 100 illustrated in FIG. 2 from which the high-potential side wire 301 and the low-potential side wire 302 are removed. FIG. 4 is an internal structure diagram of the power semiconductor device 100 illustrated in FIG. 3 from which the first submodule 401 and the second submodule 402 are removed.

As illustrated in FIG. 3, the AC output terminal 203 is electrically connected to the AC output wire 303 via the soldering material 602. Further, the AC output terminal 203 is electrically connected to a bus bar (not shown) connected to a motor by screwing, laser welding, or the like.

The positive sense terminal 204L is electrically connected to an intra-submodule positive sense wire 405L via the wire bonding 601. Further, the negative sense electrode 205L is electrically connected to an intra-submodule negative sense wire 406L via the wire bonding 601. The positive sense terminal 204L and the negative sense terminal 205L are electrically connected to a control board (not shown), and have a function of sending a control signal to the power semiconductor element 500.

As illustrated in FIGS. 3 and 8, the positive sense terminal 204U is electrically connected to the positive sense wire 304U via the wire bonding 601. The negative sense wire 304U is electrically connected to a signal relay conductor 701 via the soldering material 602. The negative sense terminal 205U is electrically connected to the negative sense wire 305U via the wire bonding 601.

As illustrated in FIG. 8, the negative sense wire 305U is electrically connected to the signal relay conductor 701 via the soldering material 602. The signal relay conductor 701 is electrically connected to an intra-submodule negative sense wire 406U via the soldering material 602. The positive sense terminal 204U and the negative sense terminal 205U are electrically connected to a control board (not shown), and have a function of sending a control signal to the power semiconductor element 500.

As illustrated in FIG. 8, the intra-submodule low-potential side conductor portion 403U of the second submodule 402 is electrically connected to the AC output wire 303 via the soldering material 602. The intra-submodule high-potential side conductor portion 404U of the second submodule 402 is electrically connected to the high-potential side wire 301 via the soldering material 602.

As described above, the second submodule 402 is electrically connected to the AC output wire 303 via the soldering material 602 in the direction inverted from the first submodule 401. As the second submodules 402 is inversely connected, a current path inside the power semiconductor device is shortened, and the effect of reducing the inductance can be expected.

Here, in a molding process, the power semiconductor device 100 is sandwiched between molds. For this reason, in a case where the height of the terminals is not uniform, problems such as resin leakage and misalignment occur, which is a problem in manufacturing.

Further, in a case where the relay terminal 701 is not used, it is necessary to invert the power semiconductor device 100 and perform wireless bonding, which may lower the productivity.

In contrast, as the signal relay conductor 701 is used, the height and thickness of the high-potential side terminal 201, the low-potential side terminal 202, the AC output terminal 203, the positive sense terminal 204, and the negative sense terminal 205 when viewed from the A-A' cross-sectional direction can be made the same, and the productivity in the molding process can be secured.

As illustrated in FIG. 8, the negative sense wire 305U is electrically connected to the signal relay conductor 701 via the soldering material 602. The signal relay conductor 701 is electrically connected to an intra-submodule negative sense wire 406U via the soldering material 602. In this manner, the heights of the wireless bonding can be made uniform on the basis of the negative sense wire 305U, and therefore, lowering in productivity can be suppressed.

The positive sense wire 304U is also connected to the intra-submodule positive sense wire 405 via the signal relay conductor 701 by the same connection. In this manner, it is possible to align the height of all the positive sense terminal 204U, the negative sense terminal 205U, the high-potential side terminal 201, and the low-potential side terminal 202.

Therefore, according to the present embodiment, the height of the terminals can be made uniform, and productivity at the time of the molding process can be secured.

Second Embodiment

A second embodiment according to the present invention will be described with reference to FIGS. 11 and 12.

Figure 11:
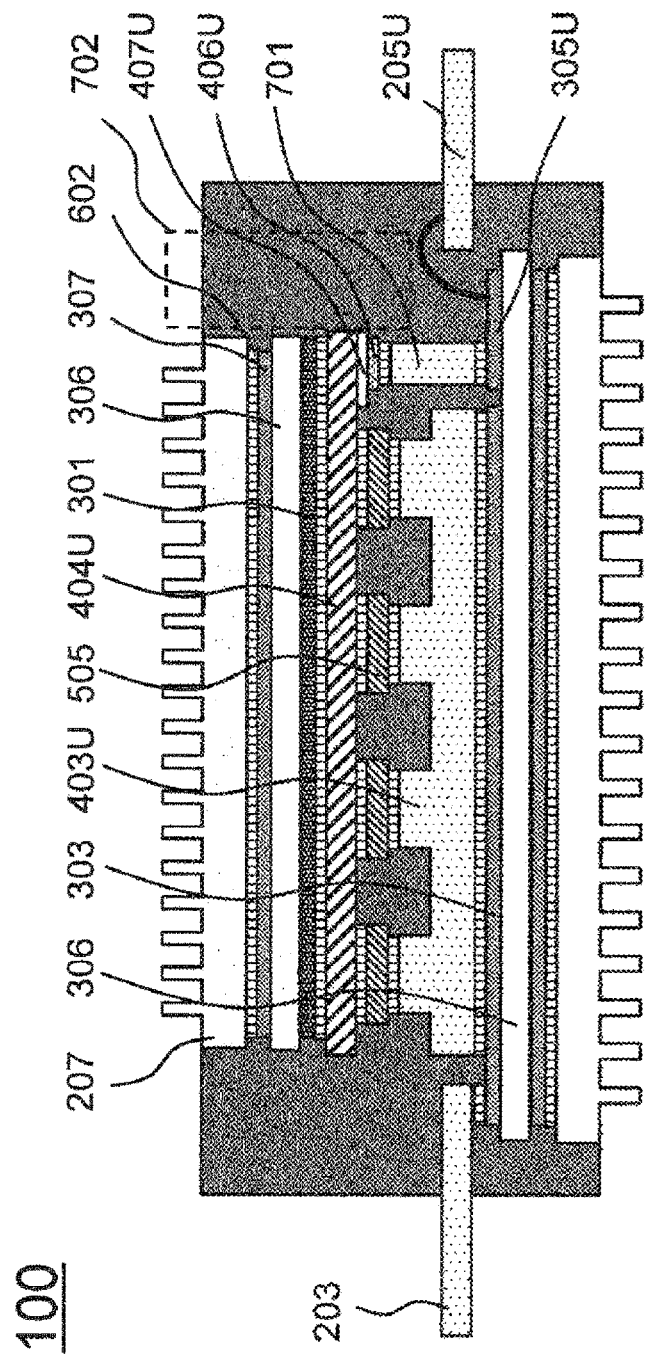
FIG. 11 is a cross-sectional view of a cross section passing through the alternate long and short dash line A-A' of the power semiconductor device 100 illustrated in FIG. 1 as viewed from an arrow direction according to a second embodiment.

FIG. 11 is a cross-sectional view of a cross section passing through the alternate long and short dash line A-A' of the power semiconductor device 100 as viewed from an arrow direction according to the second embodiment. FIG. 12 is a cross-sectional view of a cross section passing through the alternate long and short dash line B-B' of the power semiconductor device 100 illustrated in FIG. 1 as viewed from an arrow direction according to the second embodiment.

Figure 12:
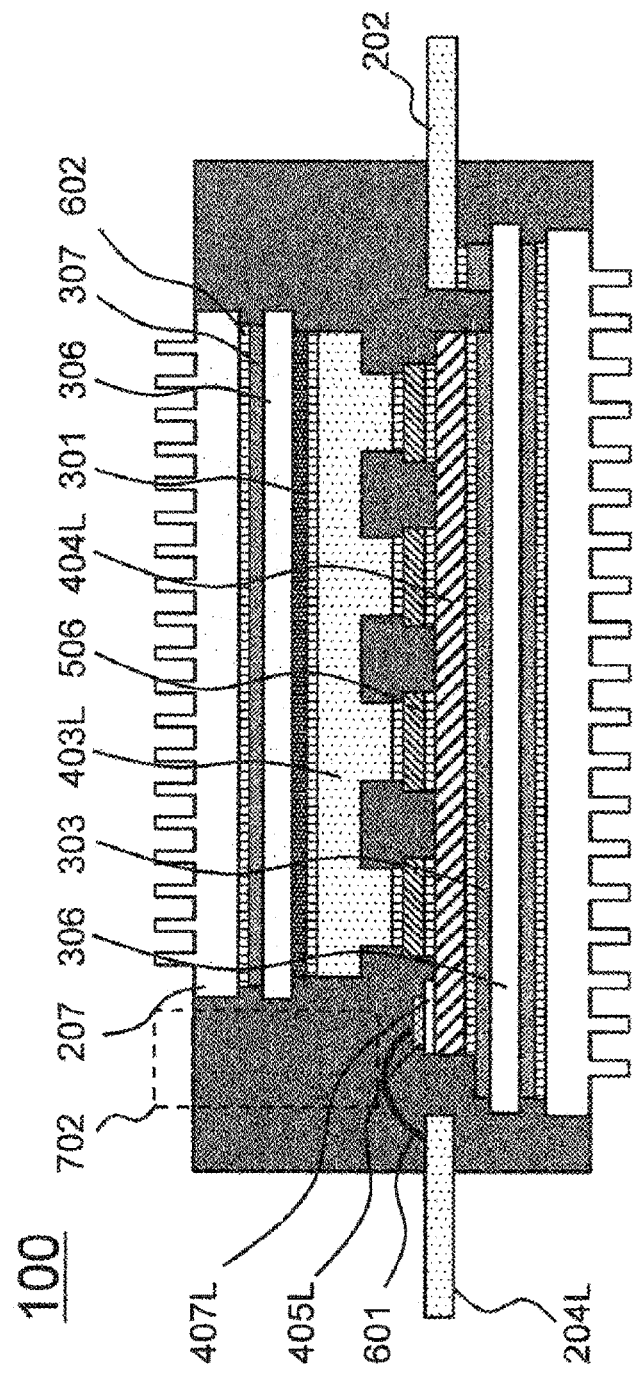
FIG. 12 is a cross-sectional view of a cross section passing through the alternate long and short dash line B-B' of the power semiconductor device 100 illustrated in FIG. 1 as viewed from an arrow direction according to the second embodiment.

In the present embodiment, as illustrated in FIGS. 11 and 12, a non-stacked portion 702 is provided above the wire bonding 601 when viewed from a direction perpendicular to an electrode surface of the power semiconductor element 500. In this manner, the wire bonding 601 is easily bonded even after a component other than the molding material 206 is solder-joined. Therefore, productivity can be secured.

FIG. 16 illustrates a manufacturing process of the power semiconductor device 100 according to the present embodiment.

FIG. 16(a-1) is a cross-sectional view of the first submodule 401 and the second submodule 402 illustrating the manufacturing process. FIG. 16(a-2) is a top view of the first submodule 401 and the second submodule 402 illustrating the manufacturing process. FIG. 16(b-1) is a cross-sectional view illustrating the manufacturing process, in which the first submodule 401 and the second submodule 402 are mounted on an AC output-side substrate 801 and a DC input-side substrate 802.

FIG. 16(b-2) is a top view illustrating the manufacturing process, in which the first submodule 401 and the second submodule 402 are mounted on the AC output-side substrate 801 and the DC input-side substrate 802. FIG. 16(c-1) is a cross-sectional view illustrating the manufacturing process, in which the wire bonding 601 is connected to FIG. 16(b-1).

FIG. 16(c-2) is a top view illustrating the manufacturing process, in which the wire bonding 601 is connected to FIG. 16(b-2).

Since the DC input-side substrate 802 is smaller than the AC output-side substrate 801, the wire bonding 601 can be connected even in a case where the non-stacked portion 702 is included and submodules are mounted on the DC input-side substrate 802 and the AC output-side substrate 801 at the same time.

FIG. 16(d-1) is a cross-sectional view illustrating the manufacturing process, in which the cooling metal portion 207 is mounted in FIG. 16(c-1). FIG. 16(d-2) is a top view illustrating the manufacturing process, in which the cooling metal portion 207 is mounted in FIG. 16(c-2).

FIG. 16(e-1) is a cross-sectional view illustrating the manufacturing process, in which FIG. 16(d-1) is resin-sealed. FIG. 16(e-2) is a top view illustrating the manufacturing process, in which FIG. 16(d-2) is resin-sealed.

According to the above manufacturing process, the process can be shortened as compared with a normal manufacturing process in which the DC input-side substrate 802 and the AC output-side substrate 801 are mounted on one side at a time, and it is possible to further suppress substrate shaving that occurs when the DC input-side substrate 802 and the AC output-side substrate 801 are mounted on one side at a time.

Third Embodiment

A third embodiment according to the present invention will be described with reference to FIGS. 13 and 14.

Figure 13:
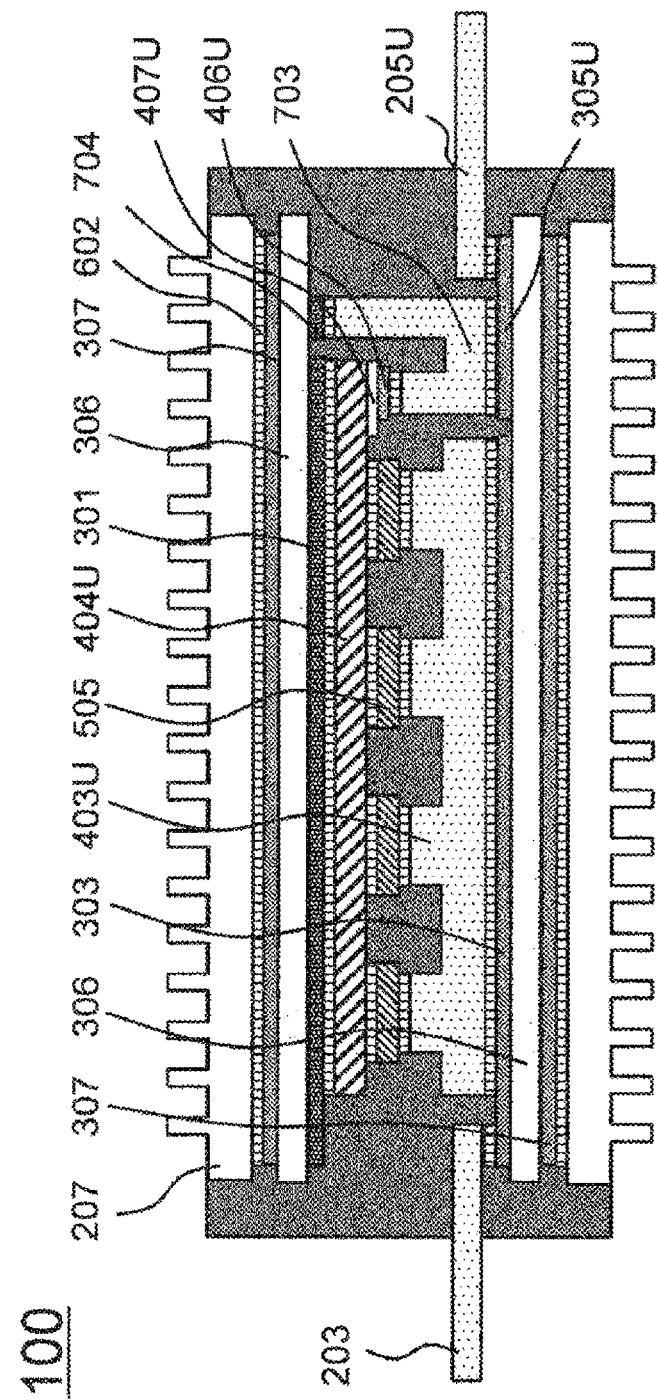
FIG. 13 is a cross-sectional view of a cross section passing through the alternate long and short dash line A-A' of the power semiconductor device 100 illustrated in FIG. 1 as viewed from an arrow direction according to a third embodiment.

FIG. 13 is a cross-sectional view of a cross section passing through the alternate long and short dash line A-A' of the power semiconductor device 100 illustrated in FIG. 1 as viewed from an arrow direction according to the third embodiment. FIG. 14 is a cross-sectional view of a cross section passing through the alternate long and short dash line B-B' of the power semiconductor device 100 illustrated in FIG. 1 as viewed from an arrow direction according to the third embodiment.

In the present embodiment, a signal relay conductor 703 has a hook shape. This makes it possible to shorten the wire bonding process while making the shapes of the upper and lower arms the same.

Figure 14:
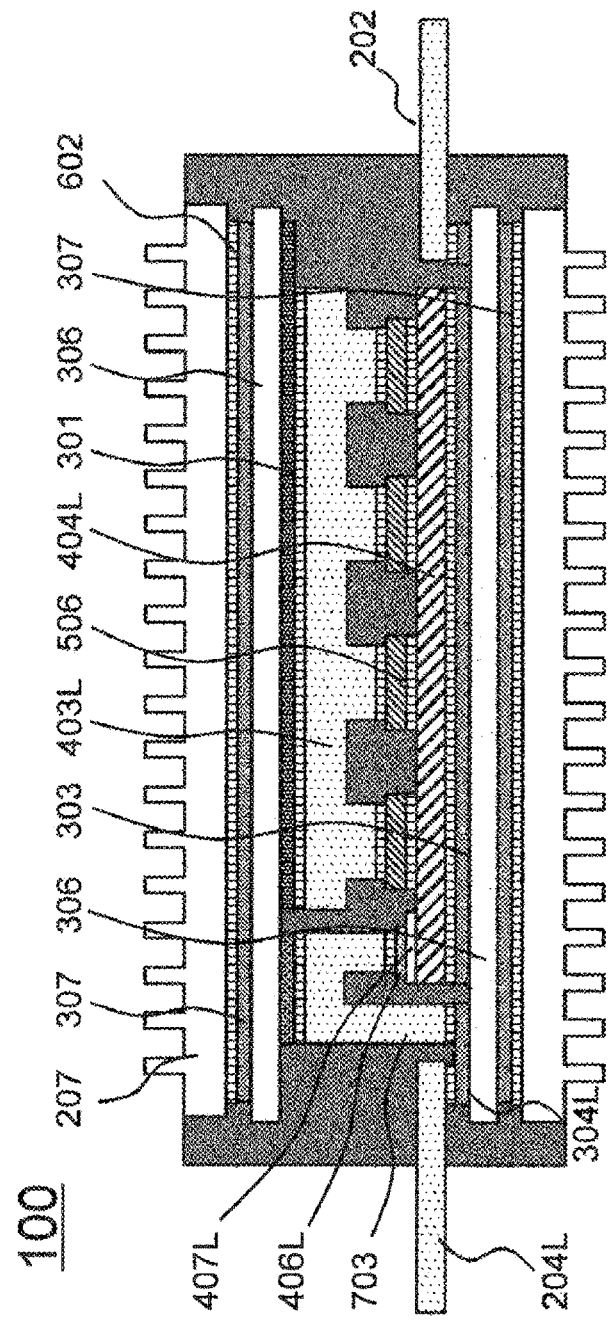
FIG. 14 is a cross-sectional view of a cross section passing through the alternate long and short dash line B-B' of the power semiconductor device 100 illustrated in FIG. 1 as viewed from an arrow direction according to the third embodiment.

As illustrated in FIGS. 13 and 14, the negative sense terminal 205U is electrically connected to the negative sense wire 305U via the soldering material 602. The negative sense wire 305U is electrically connected to the hook-shaped signal relay conductor 703 via the soldering material 602. The signal relay conductor 703 is electrically connected to the intra-submodule negative sense wire 406U and a fixing wire 704 via the soldering material 602.

The positive sense terminal 205U is electrically connected to the positive sense wire 305U via the soldering material 602. The positive sense wire 305U is electrically connected to the signal relay conductor 703 via the soldering material 602. The hook-shaped signal relay conductor 703 is electrically connected to the intra-submodule negative sense wire 406U and the fixing wire 704 via the soldering material 602.

Although not illustrated, similarly, the negative sense terminal 205L is electrically connected to a negative sense wire 305L via the soldering material 602. The negative sense wire 305L is electrically connected to the signal relay conductor 703 via the soldering material 602. The signal relay conductor 703 is electrically connected to the intra-submodule negative sense wire 406L and the fixing wire 704 via the soldering material 602.

As illustrated in FIG. 14, the positive sense terminal 204L is electrically connected to a positive sense wire 304L via the soldering material 602. The positive sense wire 304L is electrically connected to the hook-shaped signal relay conductor 703 via the soldering material 602. The hook-shaped signal relay conductor 703 is electrically connected to the intra-submodule positive sense wire 406L and the fixing wire 704 via the soldering material 602.

By using the signal relay conductor 703, it is possible to align the height of all the positive sense terminal 204U, the negative sense terminal 205U, the high-potential side terminal 201, and the low-potential side terminal 202. It is possible to align the height of all the positive sense terminal 204L, the negative sense terminal 205L, and the AC output terminal 203. By using the signal relay conductor 703, it is possible to shorten the wire bonding process while making the shapes of the upper and lower arms the same. Therefore, productivity is improved.

Fourth Embodiment

FIG. 15 is a cross-sectional view of a cross section passing through the alternate long and short dash line A-A' of the power semiconductor device 100 illustrated in FIG. 1 as viewed from an arrow direction according to a fourth embodiment. The fourth embodiment has the equivalent connection to the first embodiment except for the signal relay conductor 701.

As illustrated in FIG. 15, a signal relay wire 705 is included instead of the signal relay conductor 701 of the first embodiment. The signal relay wire 705 is electrically connected to the negative sense wire 305U and the intra-submodule negative sense wire 406U by, for example, ultrasonic joining.

The signal relay wire 705 is electrically connected to the positive sense wire 304U and an intra-submodule positive sense wire 405U by ultrasonic joining. By using the signal relay wire 705, it is possible to perform electrical connection without using the soldering material 602 used for connection of the signal relay conductor 701 of the first embodiment, and prevent lowering in yield due to non-joining of the soldering material.

The above-described embodiment, which is a preferred embodiment of the present invention, does not limit the scope of the present invention, and can be changed without departing from the gist of the present invention.

REFERENCE SIGNS LIST 100 power semiconductor device
201 high-potential side terminal
202 low-potential side terminal
203 AC output terminal
204 positive sense terminal
205 negative sense terminal
206 molding material
207 cooling metal portion
301 high-potential side wire
302 low-potential side wire
303 AC output wire
304 positive sense wire
305 negative sense wire
306 insulating layer
307 solder joint pattern
308 high-potential side terminal joint pattern
309 low-potential side terminal joint pattern
400 submodule
401 first submodule
402 second submodule
403 intra-submodule low-potential side conductor portion
404 intra-submodule high-potential side conductor portion
405 intra-submodule positive sense wire
406 intra-submodule negative sense wire
407 intra-submodule insulating layer
500 power semiconductor element
501 low-potential side electrode
502 high-potential side electrode
503 positive sense electrode
504 negative sense electrode
505 first power semiconductor element
506 second power semiconductor element
601 wire bonding
602 soldering material
701 signal relay conductor
702 non-stacked portion
703 signal relay conductor
704 fixing wire
705 signal relay wire
801 AC output-side substrate
802 DC input-side substrate
U upper arm
L lower arm

The invention claimed is:

1. A power semiconductor device comprising:
a first submodule including a first power semiconductor element;
a second submodule including a second power semiconductor element;
a positive electrode side conductor portion and a negative electrode side conductor portion;
an intermediate substrate that includes a negative electrode side facing portion facing the negative electrode side conductor portion with the first submodule sandwiched therebetween and a positive electrode side facing portion facing the positive electrode side conductor portion with the second submodule sandwiched therebetween; and
a plurality of signal terminals that transmit a signal for controlling the first power semiconductor element or the second power semiconductor element, wherein
the second submodule is disposed such that directions of an electrode surface of the second power semiconductor element and an electrode surface of the first power semiconductor element are inverted,
a signal relay conductor portion is disposed in a space sandwiched between a part of the second submodule and the intermediate substrate in a height direction of the second submodule, and
the intermediate substrate has a wire connected to the signal relay conductor portion and electrically connected to the signal terminal.

2. The power semiconductor device according to claim 1, further comprising:
a bonding wire that connects a wire provided on the intermediate substrate and the signal terminal, wherein
the intermediate substrate includes a first intermediate substrate and a second intermediate substrate sandwiching the first submodule and the second submodule, and
when viewed from a direction perpendicular to an electrode surface of the second power semiconductor element, the first intermediate substrate has a non-stacked portion that does not overlap with the second intermediate substrate, and a connection portion between the wire and the bonding wire is provided on the non-stacked portion.

3. The power semiconductor device according to claim 1, wherein the signal relay conductor is disposed in a space sandwiched between a part of the second submodule and the intermediate substrate in a height direction of the second submodule, and the intermediate substrate has a wire connected to the signal relay conductor and electrically connected to the signal terminal.

4. The power semiconductor device according to claim 1, wherein a signal relay wire is disposed in a space sandwiched between a part of the second submodule and the intermediate substrate in a height direction of the second submodule, and the intermediate substrate has a wire connected to the signal relay wire and electrically connected to the signal terminal.

5. A manufacturing method of a power semiconductor device including:

a first submodule including a first power semiconductor element;

a second submodule including a second power semiconductor element;

a positive electrode side conductor portion and a negative electrode side conductor portion;

a first intermediate substrate and a second intermediate substrate that sandwich the first submodule and the second submodule; and a plurality of signal terminals that transmit a signal for controlling the first power semiconductor element or the second power semiconductor element, the manufacturing method comprising:

a first step of disposing the first submodule and the second submodule on the first intermediate substrate side by side with a soldering material interposed therebetween such that directions of an electrode surface of the second power semiconductor element and an electrode surface of the first power semiconductor element are inverted;

a second step of disposing the second intermediate substrate on the first submodule and the second submodule with a soldering material interposed therebetween on a side opposite to a side on which the first intermediate substrate is disposed in a manner that a non-stacked portion that does not overlap with the second intermediate substrate or the first intermediate substrate is provided;

a third step of joining the first submodule, the second submodule, the first intermediate substrate, and the second intermediate substrate by melting the soldering material; and a fourth step of connecting a wire provided on the non-stacked portion and a plurality of signal terminals via a bonding wire.

* * * * *